United States Patent [19]

Komatsubara et al.

[11] Patent Number: 4,625,223
[45] Date of Patent: Nov. 25, 1986

[54] DOUBLE HETEROSTRUCTURE LIGHT-EMITTING SEMICONDUCTOR DEVICE

[75] Inventors: Tadashi Komatsubara, Tokyo; Tetsuo Sadamasa, Chigasaki, both of Japan

[73] Assignee: Kabushiki Kaisha Toshiba, Kawasaki, Japan

[21] Appl. No.: 701,513

[22] Filed: Feb. 14, 1985

[30] Foreign Application Priority Data

May 29, 1984 [JP] Japan ................. 59-108793

[51] Int. Cl.⁴ .......................................... H01L 33/00
[52] U.S. Cl. ....................................... 357/17; 357/16
[58] Field of Search ............... 357/17, 16, 61; 372/45, 372/46

[56] References Cited

U.S. PATENT DOCUMENTS 4,010,483  3/1977  Liu ......................................... 357/17
4,212,021  7/1980  Ono et al. ............................. 357/17

FOREIGN PATENT DOCUMENTS 2033155  10/1979  United Kingdom .

OTHER PUBLICATIONS

Speer et al., "Planar Double-Heterostructure GaAlAs LED's Packaged for Fiber Optics", *IEEE Transactions on Components, Hybrids and Manufacturing Technology*, vol. CHMT-3, No. 4, Dec. 1980, pp. 480–484.

Patents Abstracts of Japan, vol. 7, No. 174 (E-190) [1319], Aug. 2, 1983; & JP-A-58 80 882 (Mitsubishi Denki K.K.) 16–05–1983 *Whole document*.

Electronic Letters, vol. 15, No. 19, Sep. 13, 1979, pp. 599–600, Hitchin, Herts, GB; M. C. Amann et al.: "Small-area GaAs-GaAlAs Heterostructure Light-Emitting Diode with Improved Current Confinement", *FIGS. 1, 2; p. 599, right-hand col. lines 1–4; p. 60, left-hand col.*.

*Primary Examiner*—James W. Davie
*Assistant Examiner*—Georgia Y. Epps
*Attorney, Agent, or Firm*—Oblon, Fisher, Spivak, McClelland & Maier

[57] ABSTRACT

A double heterostructure light-emitting semi-conductor device includes a p-GaAs substrate having a first electrode formed on one surface and a current confining layer on the other surface; a confined current conduction layer; and a light-emitting layer structure formed on the current confining layer and the confined current conduction layer. A capping layer of GaAs having a second electrode is formed on the light-emitting layer structure. A light exit window layer for exiting the emitted light is constructed by a thin film of the capping layer.

3 Claims, 7 Drawing Figures

F I G. 2
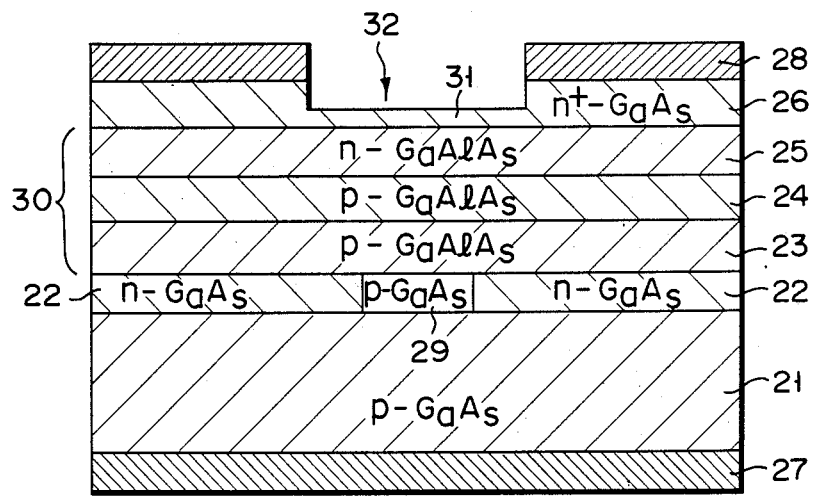

DOUBLE HETEROSTRUCTURE LIGHT-EMITTING SEMICONDUCTOR DEVICE

BACKGROUND OF THE INVENTION

The present invention relates to a double heterostructure light-emitting semiconductor device of the surface light-emitting type having double heterojunctions.

A light-emitting semiconductor device having a double heterostructure including GaAlAs layers or a GaAlAs layer and a GaAs layer is known. For example, a light-emitting semiconductor device having a structure as shown in FIG. 1 is disclosed in "IEEE Transactions On Components Hybrid and Manufacturing Technology; Vol. CHMT-3, No. 4, December 1980." In FIG. 1, a first electrode 7 is formed on one surface of a p-type GaAs substrate 1, and a current confinement layer 2 made of an n-type GaAs is formed on the other surface. A confined current conduction layer 9 is formed in a selected region of this current confinement layer 2. A light-emitting layer structure 10 is formed on the current confinement layer 2 including the current conduction layer 9. This structure 10 has a p-GaAlAs cladding layer 3, a p-GaAlAs active layer 4, and an n-GaAlAs cladding layer 5 sequentially superposed on the layer 2 and includes double heterojunctions. A light exit layer 11 made of a silicon nitride film is formed in a region within a capping layer 6 of an $n^+$-GaAs ohmically contacting the surface of the n-GaAlAs cladding layer 5. The existing layer 11 is opposed to the current conduction layer 11. Since this layer 11 has a refractive index smaller than that of the GaAlAs layer, a light generated in the light-emitting layer structure 10 can be efficiently transmitted outside through the light exit window 12. A second electrode 8 is provided on the surface of the capping layer 6 excluding the region where the layer 11 exists. Positive and negative terminals of a DC voltage source are respectively connected to the first and second electrodes 7 and 8.

The light-emitting semiconductor device is desired to produce light beams having a high brightness and a spot-shaped cross section. In order to generate very bright light beams, it is necessary to sufficiently reduce the diameter of the confined current conduction layer 9 as compared with that of the window 12, i.e., to sufficiently confine the current path through which a current between the electrodes 7 and 8 flows. Further, when a predetermined DC voltage is applied between the electrodes 7 and 8, it is desirable that a series resistance to the current flowing across the structure 10 is as small as possible. Moreover, to obtain sectional spot-shaped light beams, it is desired to concentrate the current paths between the electrodes 7 and 8 on a predetermined region. When considering the device shown in FIG. 1 from the above-described standpoint, it is clear that the current passed through the conduction layer 9 obliquely moves the structure 10 toward the layer 6. Therefore, the series resistance of the structure 10 for the oblique current flow increases, and the light emitting efficiency is lowered when a constant voltage is applied between the electrodes 7 and 8. In addition, since a current does not substantially flow from the layer 9 toward the layer 11 of the silicon nitride film, the light beams generated from the light exit window present a ring-shaped near field pattern.

SUMMARY OF THE INVENTION

It is an object of the present invention to provide a double heterostructure light-emitting semiconductor device capable of decreasing a resistance to a current flowing across a light-emitting layer structure, decreasing a voltage applied between electrodes, and outputting high intensity spot-shaped light beams.

The double heterostructure light-emitting semiconductor device of the present invention comprises a semiconductor substrate selected from a first conductivity type GaAs substrate and a first conductivity type GaAlAs substrate; a first electrode provided on one surface of the semiconductor substrate; a current confining layer formed on the other surface of the semiconductor substrate; a confined current conduction layer formed in a selected region of the current confining layer; a light-emitting semiconductor layer structure having double heterojunctions and formed on the current confining layer including the selected region; a capping layer structure having a first layer formed on the free surface of the light-emitting semiconductor layer structure; a light exit window layer formed in a region in the first layer, the region being opposed to the confined current conduction layer; and a second electrode formed on the outer surface of the capping layer structure except the light exit window layer region. The light exit window layer is constructed of a film of the same material as the first layer of the capping layer structure.

BRIEF DESCRIPTION OF THE DRAWINGS

FIG. 2 is a sectional view of a double heterostructure light-emitting semiconductor device of a first embodiment according to the present invention;

DETAILED DESCRIPTION OF THE PREFERRED EMBODIMENTS

Figure 1:
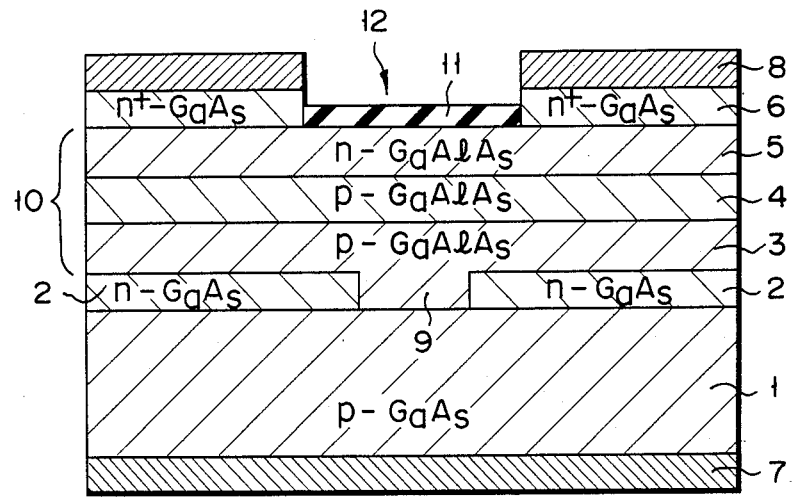
FIG. 1 is a sectional view of a conventional double heterostructure light-emitting semiconductor device.

In FIG. 2, a first electrode 27, to which a positive terminal of a driving DC voltage source is connected, is formed on one surface of a p-GaAs substrate 21. An n-GaAs current confining layer 22 is formed on the other surface, and a p-GaAs confined current conduction layer 29 is formed substantially at the center in the layer 22. This confined current conduction layer 29 is formed, for example, by diffusing Zn in the layer 22. Layers 23, 24, and 25 which construct a light-emitting semiconductor layer structure 30 are sequentially formed on the layer 22 including the layer 29. The layer 23 is a p-$Ga_{0.65}Al_{0.35}As$ layer, the layer 24 is a p-$Ga_{0.94}Al_{0.06}As$ layer, and the layer 25 is an n-$Ga_{0.65}Al_{0.35}As$ layer. Double heterojunctions are formed of the junction of the layers 23 and 24, and the junction of the layers 24 and 25. The layer 23 is called "a cladding layer", the layer 24 is called "an active layer", and the layer 25 is called "a cladding layer". Here, the contents of aluminum in the layers 23 and 25 are selected to be approximately 6 to 10 times that of aluminum in the layer 24. An n+-GaAs capping layer 26 is formed on the free surface of the light emitting layer structure 30. The thickness of the light exit window layer 31 which opposes the confined current conduction layer 29 and forms the light exit window 32 is 0.02 to 2.0 microns. The layer 31 is a part of the capping layer 26. The negative terminal of the driving DC voltage source is connected to an electrode 28 which is brought into contact with the upper surface of the capping layer 26. The capping layer 26 is ohmically contacted with the n-GaAlAs layer 25.

Then, a method for manufacturing the light-emitting semiconductor device shown in FIG. 2 will be described in detail.

First, the p-GaAs substrate 21 is prepared, and the n-GaAs layer 22 is formed to a thickness of approximately 5 microns on the surface opposed to the surface formed with the first electrode 27. To form the layer 22, one of the liquid phase epitaxial growth method and vapour phase epitaxial growth method may be employed. For example, when the liquid phase epitaxial growth method is employed, a Ga-solution containing Te and GaAs is contacted with the substrate 31 at approximately 830° C., and the solution is gradually cooled, thereby forming the n-GaAs layer 22. Then, a mask having an opening at the region of the confined current conduction layer 29 is formed on the n-GaAs layer 22 by a PEP(photoengraving process), and Zn is then selectively diffused through the opening, thereby forming the p-GaAs layer 29. Subsequently, the light-emitting semiconductor layer structure 30 is formed on the layer 22 containing the layer 29.

The light-emitting semiconductor layer structure 30 and the capping layer 26 may be formed according to the following method. An epitaxial growth boat, in which reservoirs for semiconductor solutions for forming the layers 23, 24, 25, and 26 are aligned in series is prepared, a carbon material being arranged between adjacent reservoirs, and the substrate 21 formed with the layers 22 and 29 is moved along the lower portions of the reservoirs. 100 g of Ga, 7.5 g of GaAs, 150 mg of Al and 3 g of Ge are contained in the first reservoir for forming the p-GaAlAs layer 23. A solution containing 100 g of Ga, 7.5 g of GaAs, 15 mg of Al and 3 g of Ge is contained in the second reservoir for forming the p-GaAlAs layer 24. A solution containing 100 g of Ga, 7.5 g of GaAs, 150 mg of Al and 6 mg of Te is contained in the third reservoir for forming the n-GaAlAs layer 25. A solution containing 100 g of Ga, 7.5 g of GaAs, and 6 mg of Te is contained in the fourth reservoir for forming the N+-GaAs layer 26. Then, the surface-structured substrate including the layers 21, 22 and 29 and the respective solution reservoirs are heated to approximately 850° C. Subsequently, the layers 22 and 29 are brought into contact with the solution of the first reservoir, and the solution is gradually cooled at the cooling velocity of 1° C./min., thereby forming the p-GaAlAs layer 23. Then, the surface-structured substrate is moved to the second reservoir to be brought into contact with the solution of the second reservoir, and the solution is gradually cooled at the cooling velocity of 1° C./min., thereby forming the p-GaAlAs layer 24. Similarly, the layers 25 and 26 are formed.

Then, a mask pattern having an opening of the same size as the window 32 is formed on the n+-GaAs capping layer 26. Thereafter, the layer 26 is selectively etched through the mask pattern by a mixture solution comprising a phosphoric acid, a hydrogen peroxide and a methyl alcohol until the thickness of the light-exit window layer (n+-GaAs layer) 31 becomes, for example, 0.3 microns. Then, the first electrode 27 is formed of an AuZn alloy, and the second electrode 28 is formed of an AuGe alloy.

The layer 26 has approximately 20 mΩ·cm of resistivity when the carrier concentration is $1 \times 10^{17}/cm^3$ and 0.5 mΩ·cm when the concentration is $1 \times 10^{19}/cm^3$. It is found that the thickness of approximately 5 microns is necessary to epitaxially grow the capping layer 26 so as to maintain a stable state as the n-GaAlAs layer. It is found that the carrier concentration of the capping layer 26 is desirably set to $1 \times 10^{18}/cm^3$ or higher to make the resistance of the capping layer 26 having the thickness of 5 microns sufficiently low. The reason why the layer 31 is limited to 0.2 to 2.0 microns as described above is because, if it is 0.2 microns or smaller, the series resistance of the structure 30 cannot be decreased to a desired degree or lower, and a satisfactory spot-shaped light beams cannot be obtained in the window 32, and if it is 2.0 microns or larger, the attenuation of the output power in the layer 31 increases. As a result, the object of the present invention cannot be sufficiently achieved. In FIG. 1, the confined current conduction layer 29 is simultaneously formed when the p-GaAlAs layer 3 is formed. However, when part of the layer 22 is converted into the p-GaAs layer as shown in FIG. 2, there arises an advantage such that a stepwise difference does not occur on the layers 23, 24, and 25 when forming the layers 23, 24, and 25.

Figure 3A:
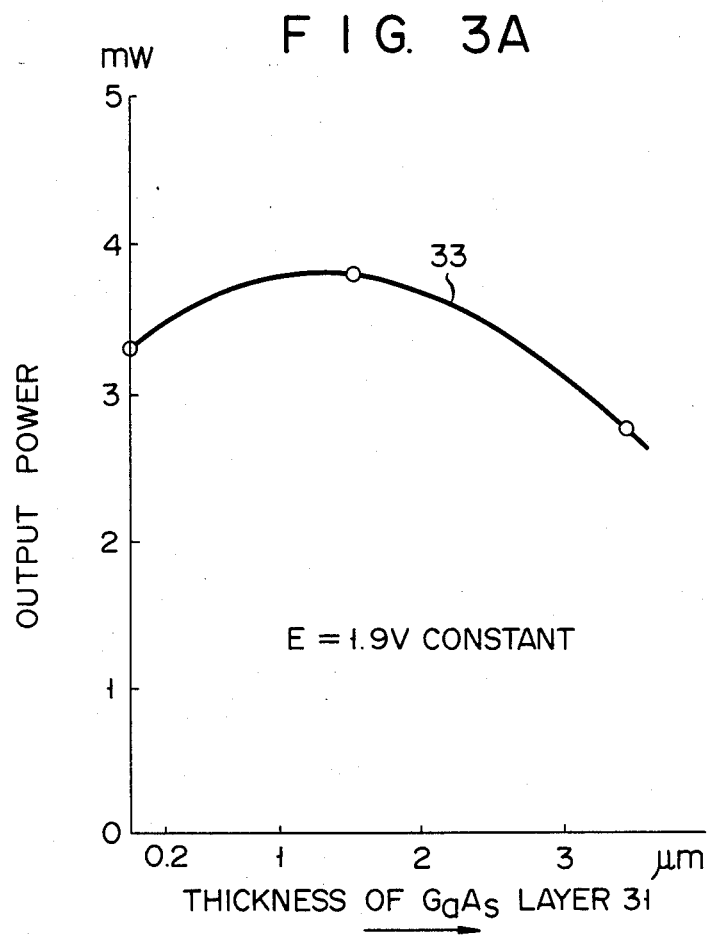
FIG. 3A is a view showing the relationship between the thickness (abscissa axis) of the light exit window layer and an output power (ordinate axis) obtained from the light exit window in FIG. 2.
Figure 3B:
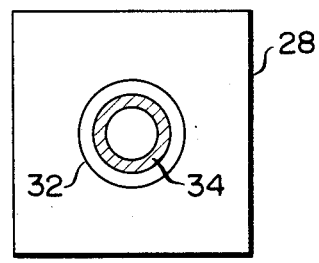
FIG. 3B is a near field pattern of light beams obtained from the light exit layer window of FIG. 2.
Figure 3C:
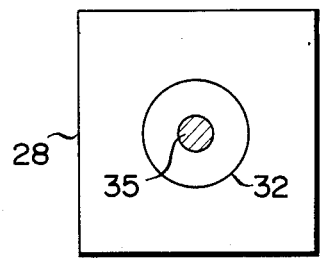
FIG. 3C is a near field pattern of light beams similarly obtained from the light exit layer of FIG. 2.

FIG. 3A shows a characteristic curve 33 illustrating the relationship between the thickness (microns) of the light exit window layer 31 and the output power generated in the window 32 in FIG. 2. When the thickness of the layer 31 is in a range of 0.2 to 2.0 microns, a relatively high output power can be produced. FIG. 3B shows the fact that, when the thickness of the layer 31 is 0.2 microns or less, the current obliquely crossing the structure 30 between the layer 29 and the second electrode 28 contributes to the light emission, and the light beams 34 generated in the window 32 have a ring-shape near field pattern. When the thickness of the layer 31 is, for example, selected to 0.2 to 2 microns, the current component crossing that part of the structure 30 between the layers 29 and 31 exists, and the cross section of the light beams generated in the window 32 substantially becomes a spot-shape.

Figure 4:
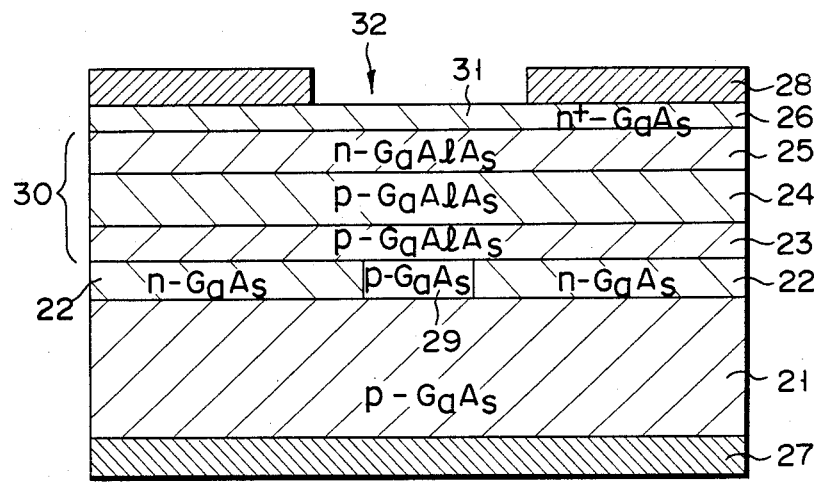
FIG. 4 is a sectional view of a double heterostructure light-emitting semiconductor device of another embodiment according to the present invention.

In another embodiment of the present invention shown in FIG. 4, the thickness of the n+-GaAs capping layer 26 is formed to be equal to that of the light exit window layer 31. Even in this embodiment, when the thicknesses of both layers 26 and 31 are suitably selected, the advantages of the embodiment in FIG. 2 can be provided.

Figure 5:
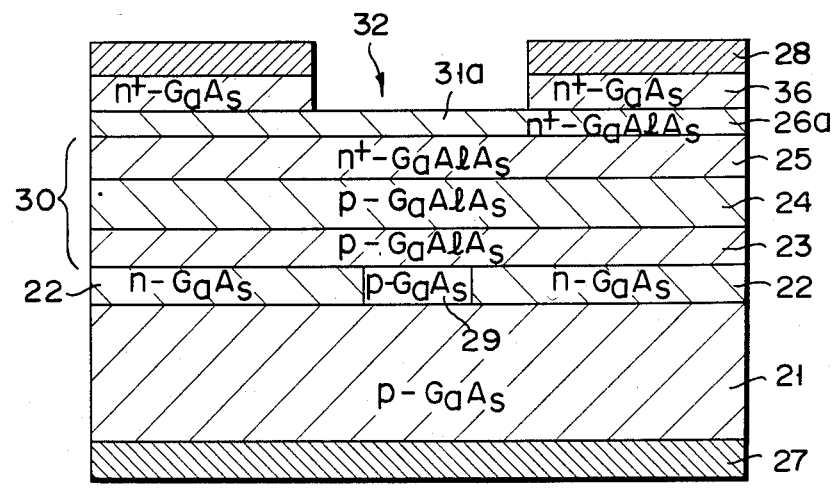
FIG. 5 is a sectional view of a double heterostructure light-emitting semiconductor device of still another embodiment according to the invention.

FIG. 5 shows still another embodiment of the present invention. What is different from the embodiment shown in FIG. 2 is the capping layer structure in FIG. 4 has a first layer 26a made of n+-GaAlAs and formed on the n-GaAlAs layer 25 and a second layer 36 made of n+-GaAs. A light exit window layer 31a is formed on part of the first layer 26a. The second capping layer 36 made of the n+-GaAs is formed on the first layer 26a except the light exit window region, and the second electrode 28 is formed on the second capping layer 26. The advantages of this embodiment are such that the n+-GaAlAs layer 31a is not etched when etching the second capping layer 36 for forming the window 32 and that the layer 31a has a light absorption smaller than the n+-GaAs layer of FIG. 4. Therefore, the light-emitting semiconductor device which is further improved in characteristics can be provided.

The present invention is not limited to the particularly embodiments described above. For example, a GaAlAs substrate may be used instead of the GaAs substrate 21, an n-GaAs may be used instead of the p-GaAlAs active layer, and an n-GaAlAs layer may be used instead of the n-GaAs current confining layer 22.

What is claimed is:

1. A double heterostructure light-emitting semiconductor device comprising:

a semiconductor substrate selected from a first conductivity type GaAs substrate and a first conductivity type GaAlAs substrate;

a first electrode provided on one surface of said semiconductor substrate;

a current confining layer formed on the other surface of said semiconductor substrate;

a confined current conduction layer formed in a selected region of said current confining layer;

a light-emitting semiconductor layer structure having a double heterojunction and formed on said current confining layer including said selected region; and a capping layer formed of a second conductivity type GaAs layer on the free surface of said light-emitting semiconductor layer structure;

wherein said capping layer has a carrier concentration of $1 \times 10^{18}/cm^3$ or higher and includes first and second portions, said first portion being used as a light exit window layer and the thickness thereof being in a range of 0.2 to 2.0 microns and said second portion having a second electrode provided thereon.

2. A double heterostructure light-emitting semiconductor device according to claim 1, wherein said current confining layer is a layer selected from said second conductivity type GaAs layer and a second conductivity type GaAlAs layer;

said light-emitting layer structure includes a first conductivity type GaAlAs clad layer, an active layer selected from a first conductivity type GaAlAs layer and a first conductivity type GaAs layer, and a second conductivity type GaAlAs clad layer, which are sequentially superposed on said current confining layer.

3. A double heterostructure light-emitting semiconductor device according to claim 2, wherein said confined current conduction layer is formed of said first conductivity type GaAs.

* * * * *